(12) United States Patent
Kamata et al.

(10) Patent No.: US 7,138,682 B2
(45) Date of Patent: Nov. 21, 2006

(54) ORGANIC THIN-FILM TRANSISTOR AND METHOD OF MANUFACTURING THE SAME

(75) Inventors: Toshihide Kamata, Tsukuba (JP); Manabu Yoshida, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 43 days.

(21) Appl. No.: 10/498,349

(22) PCT Filed: Dec. 27, 2002

(86) PCT No.: PCT/JP02/13761

§ 371 (c)(1),
(2), (4) Date: Jun. 17, 2004

(87) PCT Pub. No.: WO03/058723

PCT Pub. Date: Jul. 17, 2003

(65) Prior Publication Data

US 2005/0121674 A1    Jun. 9, 2005

(30) Foreign Application Priority Data

Dec. 28, 2001  (JP) ............................. 2001-400917
Aug. 21, 2002  (JP) ............................. 2002-240449

(51) Int. Cl.
*H01L 29/786* (2006.01)
(52) U.S. Cl. ................... 257/329; 257/66; 257/40; 257/E29.274; 438/156; 438/151
(58) Field of Classification Search ............. 438/151, 438/158, 159, 161, 156, 272; 257/60, 72, 257/40, 66, 329, E29.274
See application file for complete search history.

(56) References Cited

U.S. PATENT DOCUMENTS

| 4,547,789 A | * | 10/1985 | Cannella et al. | ............... 257/57 |
| 4,633,284 A | * | 12/1986 | Hansell et al. | ................ 257/58 |
| 4,700,458 A | * | 10/1987 | Suzuki et al. | ............... 438/160 |
| 4,701,996 A | * | 10/1987 | Calviello | .................... 438/173 |
| 4,859,623 A | * | 8/1989 | Busta | ........................ 438/30 |

(Continued)

FOREIGN PATENT DOCUMENTS

JP           58-46680           3/1983

(Continued)

OTHER PUBLICATIONS

J. H. Schön, et al., Science, vol. 287, pp. 1022-1023 Feb. 11, 2000.

(Continued)

*Primary Examiner*—Bradley K. Smith
*Assistant Examiner*—Steven J. Fulk
(74) *Attorney, Agent, or Firm*—Oblon, Spivak, McClelland, Maier & Neustadt, P.C.

(57) ABSTRACT

A thin-film transistor includes a substrate (10), a gate electrode (20) provided on a portion of the substrate, an insulation layer (30) arranged to cover the gate electrode and the substrate, a source or drain (40) provided on the insulation layer in a region corresponding to a region of the gate electrode, a semiconductor layer (50) arranged to cover the source or drain (40) and the insulation layer, a drain or source (60) provided on the semiconductor in a portion of a region corresponding to a region of the source or drain (40) that overlaps with the gate electrode, and a channel (70) formed between the source or drain (40) and the drain or source (60) and having a length defined by a film thickness of the semiconductor layer (50).

19 Claims, 11 Drawing Sheets

U.S. PATENT DOCUMENTS

| | | | |
|---|---|---|---|
| 5,039,622 A * | 8/1991 | Ishihara | 438/156 |
| 5,432,102 A * | 7/1995 | Cho et al. | 438/156 |
| 5,447,789 A * | 9/1995 | Griffin | 428/308.4 |
| 5,574,294 A * | 11/1996 | Shepard | 257/66 |
| 5,674,757 A * | 10/1997 | Kim | 438/159 |
| 5,864,149 A * | 1/1999 | Yamamori | 257/59 |
| 5,953,595 A * | 9/1999 | Gosain et al. | 438/158 |
| 6,107,117 A * | 8/2000 | Bao et al. | 438/99 |
| 6,136,702 A | 10/2000 | Chandross et al. | |
| 6,232,157 B1 * | 5/2001 | Dodabalapur et al. | 438/158 |
| 6,344,662 B1 * | 2/2002 | Dimitrakopoulos et al. | 257/40 |
| 6,429,457 B1 * | 8/2002 | Berggren et al. | 257/60 |
| 2002/0009836 A1* | 1/2002 | Takechi | 438/151 |
| 2002/0053666 A1* | 5/2002 | Marks et al. | 257/40 |

FOREIGN PATENT DOCUMENTS

| | | |
|---|---|---|
| JP | 60-161672 | 8/1985 |
| JP | 62-66664 | 3/1987 |
| JP | 63-10182 | 1/1988 |
| JP | 2-56970 | 2/1990 |
| JP | 2-192766 | 7/1990 |

OTHER PUBLICATIONS

J. Collet, et al., Applied Physics Letters, vol. 76, No. 14, pp. 1941-1943 Apr. 3, 2000.

H. Sirringhaus, et al., Science, vol. 290, pp. 2123-2126 Dec. 15, 2000.

Y. Yang, et al., Nature, vol. 372, pp. 344-346 Nov. 24, 1994.

K. Kudo, et al., Sythetic Metals, vol. 111-112, pp. 11-14 2000.

* cited by examiner

ORGANIC THIN-FILM TRANSISTOR AND METHOD OF MANUFACTURING THE SAME

TECHNICAL FIELD

The present invention relates to a thin-film transistor. More particularly, the invention relates to an organic thin-film transistor which uses an organic semiconductor as a semiconductor layer to improve thin-film transistor characteristics and which can also be fabricated using a simple, convenient process, such as printing or the like, and to a method of manufacturing the same.

BACKGROUND ART

In recent years, various integrated circuit technologies have been proposed that use organic semiconductor thin-film transistors. It is expected that it will be possible to fabricate such integrated circuits by a simple, convenient manufacturing method, such as printing technology or the like, while other advantages include the possibility of realizing large-area processing and low-cost manufacturing processes, and good compatibility for fabrication on flexible substrates. This is also attracting expectations for the good compatibility with integrated circuit technology that will enable the low-price supply of electronic equipment, such as portable displays and electronic tags, such as electronic price tags and electronic labels and the like.

The development of thin-film transistors using organic semiconductors has been gradually becoming more active since the latter half of the 1980s, and in recent years has reached the point where, in terms of basic performance characteristics, it has surpassed amorphous silicon thin-film transistors. A representative example of this is the performance of a thin-film transistor using pentacene as the organic semiconductor, reported by Schön, et al., in Science, volume 287, page 1022 (2000).

The basic device structure of an organic semiconductor thin film up to now has generally been either what is called a bottom contact structure, as shown in FIG. 21, comprising layers constituted by a gate electrode 21 formed on a substrate 11, an insulation layer 31 formed on the gate electrode 21, on which are then formed, in parallel and simultaneously, a source 61 and a drain 41, and a semiconductor layer 51 formed thereon; or what is called a top contact structure, as shown in FIG. 22, comprising layers constituted by a gate electrode 22 formed on a substrate 12, an insulation layer 32 formed on the gate electrode 22, a semiconductor layer 52 formed on the insulation layer, on which are then formed, in parallel and simultaneously, a source 62 and a drain 42. These device structures are both characterized by the source and drain being fabricated in parallel and simultaneously. In endeavoring to improve basic properties, such as the high-speed responsiveness and low-voltage driving of a thin-film transistor, one of the most critically important factors is to shorten the distance between the source and drain, that is, the channel length. However, if the type of structure shown in FIG. 21 or FIG. 22 is used, just how short a distance between the source and the drain can be obtained depends in most cases on the basic fine processing technology. Although various techniques have been studied up until now, the problem is that a superior technique has yet to be established.

Of the known methods of fabricating the source and drain in parallel and simultaneously, one of the most simple and convenient methods is to adapt a method of forming electrodes under a vacuum, such as by vacuum deposition or sputtering or the like, using a mask. A problem with this method is that, so long as an ordinary mask is used, it is difficult to obtain a short source-drain distance of or below 10 μm. Another problem is that when a special mask is used that can be adapted to fine processing a single fabrication of an electrode clogs the mask, making it unsuitable for mass-fabrication.

The most representative technology used to obtain a shorter channel is photolithography. With respect also to organic thin-film transistors, there are reports, including Applied Physics Letters, volume 76, page 1941, 2000, that describe the use of photolithography technology to form channels having a shorter length, thereby obtaining superior thin-film transistor characteristics. However, in order to thus apply the technology, the semiconductor layers of the thin-film transistor are composed of organic material, which makes it difficult to introduce the operation of washing off the photo-mask with an organic solvent. Moreover, even if manufacturing processes were to be devised to which photolithography could be adapted, thereby enabling the performance provided by a thin-film transistor to be utilized, when the cost and time requirements of the photolithography technology are taken into consideration, it becomes impossible to achieve the low-cost, low-energy production that characterizes the use of organic material for thin-film transistors.

It is known that electron beam lithography technology can be used to obtain a shorter channel length than that obtained using photolithography technology. There is a report that describes a technology that achieves a very short channel length of 30 nm by using electron beam lithography, thereby enabling low-voltage driving of 0.35 V/decade at a source-drain voltage of 1 V (Applied Physics Letters, volume 76, page 1941, 2000). However, a problem with this technology is that it requires the adapting of electron beam lithography, which, being an extremely high-level, costly technology, means that the characterizing ability to adapt a simple, convenient process, such as printing or the like, provided by the use of organic material for thin-film transistors, is not achieved. Another problem is that of reduced throughput.

A technology that uses printing to fabricate devices is reported in Science, volume 290, page 2123, (2000). This achieves a short channel length of 5 μm by positioning fine spacer rods at the electrodes between the source and the drain. However, a problem with the technology is that the channel length depends on the width of the spacers, which necessarily means a reliance on fine-processing technology for how fine the spacers can be manufactured.

The use of a static induction transistor that is a transistor, in which the control of the channel length is not dependent on fine processing technology, has been reported (Nature, volume 372, page 344, 1994, and Synthetic Metals, volume 111, page 11, 2000). With this transistor structure, the channel length can be controlled by the thickness of the films that are fabricated. However, the thin-film transistor in this case has a different operating principle, so the circuit design pointers have to be changed in order to incorporate it as a conventionally applied thin-film transistor. Another problem is that although source-drain fabrication is easy, it is extremely difficult to fabricate the gate electrode.

As described above, in order to improve transistor characteristics, it is necessary to shorten the channel (the distance between the source and the drain) in which the current flows. In the prior art, the channel has been shortened adapting a high-level, fine processing technology, such as photolithography or electron beam lithography. It has been difficult to fabricate low-cost, high performance devices with these methods, due to the very high level and high cost of the adapted fine processing technologies.

Furthermore, drastically reducing the channel length has given rise to a problem in terms of the transistor characteristics, caused by an increase in the leakage current between the source and the drain that has made it impossible to obtain a large current amplification ratio (on/off ratio).

An object of the invention is to provide an organic thin-film transistor in which channel length is precisely controlled to improve basic transistor characteristics, and a method of manufacturing the transistor.

Another object of the invention is to provide a thin-film transistor that reduces leakage current arising between the source and the drain in cases in which the channel length is shortened.

DISCLOSURE OF THE INVENTION

An organic thin-film transistor according to the invention comprises a substrate, a gate electrode provided on a portion of the substrate, an insulation layer arranged to cover the gate electrode and the substrate, a source or drain provided on the insulation layer in a region corresponding to a region of the gate electrode, a semiconductor layer arranged to cover the source or drain and the insulation layer, a drain or source provided on the semiconductor in a portion of a region corresponding to a region of the source or drain that overlaps with the gate electrode, and a channel formed between the source or drain and the drain or source and having a length (channel length) defined by a film thickness of the semiconductor layer.

Also, a thin-film transistor according to the invention comprises a substrate, a source or drain provided on a portion of the substrate, a semiconductor layer arranged to cover the source or drain and the substrate, a drain or source provided on the semiconductor in a portion of a region corresponding to a region of the source or drain, an insulation layer arranged to cover the drain or source, a gate electrode provided on the insulation layer in a region corresponding to a region of the drain or source that overlaps with the source or drain, and a channel formed between the source or drain and the drain or source and having a length (channel length) defined by a film thickness of the semiconductor layer.

The first mentioned thin-film transistor of the invention also includes another insulation layer provided on an upper part of the source or drain.

The above thin-film transistor of the invention also includes a semiconductor layer that is composed of organic semiconductor material and has a thickness of not more than 1 μm.

The above thin-film transistor of the invention also includes one of the source and the drain being composed of a material having a high work function selected from among gold, palladium, copper, nickel, indium-tin oxide and polythiophene, or materials that are a combination of a plurality thereof, and the other of the source and the drain being composed of a material having a low work function selected from among indium, aluminum, silver, calcium, magnesium and lithium or materials that are a combination of a plurality thereof.

The above thin-film transistor of the invention also includes the semiconductor layer being formed of a p-type organic semiconductor material, whichever of the source or the drain that is nearer to the gate electrode being composed of a material having a high work function and whichever of the source or the drain that is further from the gate electrode being composed of a material having a low work function.

The above thin-film transistor of the invention also includes the p-type semiconductor material being selected from among pentacene, tetracene, thiophene, phthalocyanine and derivatives thereof each with its terminal substituted, polythiophene, polyphenylene, polyphenylene vinylene, polyfluorene and derivatives thereof each with its terminal substituted or polymers of derivatives thereof each with its side chain substituted.

The above thin-film transistor of the invention also includes the semiconductor layer being formed of an n-type organic semiconductor material, whichever of the source or the drain that is nearer to the gate electrode being composed of a material having a low work function and whichever of the source or the drain that is further from the gate electrode being composed of a material having a high work function.

The above thin-film transistor of the invention also includes the above n-type semiconductor being selected from among perylene tetracarboxylic dianhydride, naphthalene tetra carboxylic dianhydride, fluorinated phthalocyanin and derivatives thereof each with its terminal substituted.

In a method of manufacturing a thin-film transistor in which a gate electrode, an insulation layer, a source or drain, a semiconductor layer and a drain or source are formed on a substrate, the method of manufacturing the thin-film transistor of the invention comprises arranging the gate electrode on a portion of the substrate, covering the gate electrode and the substrate with the insulation layer, arranging the source or drain on the insulation layer in a region corresponding to a region of the gate electrode, covering the source or drain and the insulation layer with the semiconductor layer, forming the drain or source on the semiconductor layer in a region corresponding to a region of the source or drain to at least cover a portion of the source or drain that overlaps with the gate electrode, and forming a channel layer between the source or drain and the drain or source and having a channel length defined by a film thickness of the semiconductor layer.

Also, in a method of manufacturing a thin-film transistor in which a source or drain, a semiconductor layer, a drain or source, an insulation layer and a gate electrode are formed on a substrate, the method of manufacturing the thin-film transistor of the invention comprises arranging the source or drain on a portion of the substrate, covering the source or drain and the substrate with the semiconductor layer, arranging a drain or source on the semiconductor layer in a portion of a region corresponding to a region of the source or drain, covering the drain or source with the insulation layer, arranging the gate electrode on the insulation layer in a region corresponding to a region of the drain or source that overlaps with the source or drain, and forming a channel layer between the source or drain and the drain or source and having a channel length defined by a film thickness of the semiconductor layer.

Also, the above method of manufacturing the thin-film transistor of the invention includes fabricating at least part of component elements of the transistor by coating or affixment of a solution.

The invention also provides a display device which is fabricated using the thin-film transistor according to the invention and which includes a display portion that is an electroluminescent device, a liquid crystal device or an electrophoresis device.

The invention also provides a memory device in which ferroelectric material is used for all or part of the insulation layer contacting the gate electrode in the thin-film transistor, wherein the ferroelectric material is organic dielectric material.

The invention also provides a thin-film transistor integrated circuit in which the thin-film transistor is disposed at a plurality of locations.

Since the organic thin-film transistor of the invention is composed of organic semiconductor thin film, by adapting the thin-film thickness to the distance between the source and the drain, an extremely short channel length can be precisely formed without using high-level fine processing technology.

Also, because the transistor device structure is composed of thin-film layers, printing technology can be adapted and it can be readily manufactured with good control.

Also, leakage current between the source and the drain can be reduced through the formation of the source and the drain from materials having different work functions.

BRIEF DESCRIPTION OF DRAWINGS

FIG. 11(a) is a plan view of the gate electrode.

FIG. 11(b) is a cross section of the state of the gate electrode vapor-deposited on the substrate.

FIG. 12(a) is a plan view of the state of the insulation film formed on the gate electrode.

FIG. 12(b) is a cross section of the state of FIG. 12(a).

FIG. 13(a) is a plan view of the state of the insulation film formed on the drain.

FIG. 13(b) is a cross section of the state of FIG. 13(a).

FIG. 14(a) is a plan view of the state of the semiconductor layer, including the drain, vapor-deposited on the insulation layer.

FIG. 14(b) is a cross section of the state of FIG. 14(a).

FIG. 15(a) is a plan view of the state of the source vapor-deposited on the semiconductor layer.

FIG. 15(b) is a cross section of the state of FIG. 15(a).

BEST MODE FOR CARRYING OUT THE INVENTION

Focusing on the point that, in the case of an organic thin-film transistor, it seemed possible to make the thin-film thickness very thin without adapting special fine processing technology, the present inventors perfected this invention from the finding that adapting this feature to control the distance between the source and the drain made it possible to realize a very short channel length without adapting high-level fine processing technology.

Figure 1:
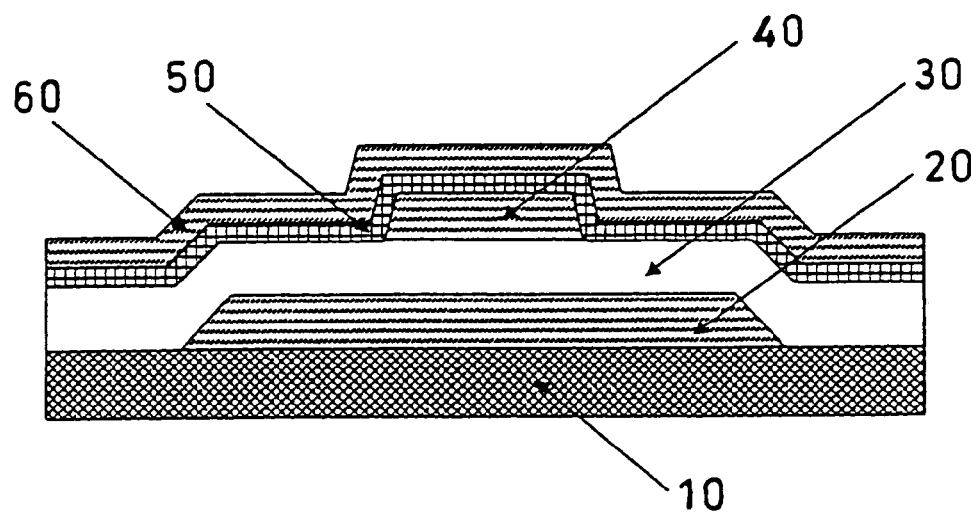
FIG. 1 is a typical cross section of an example of the organic thin-film transistor of the present invention.
Figure 2:
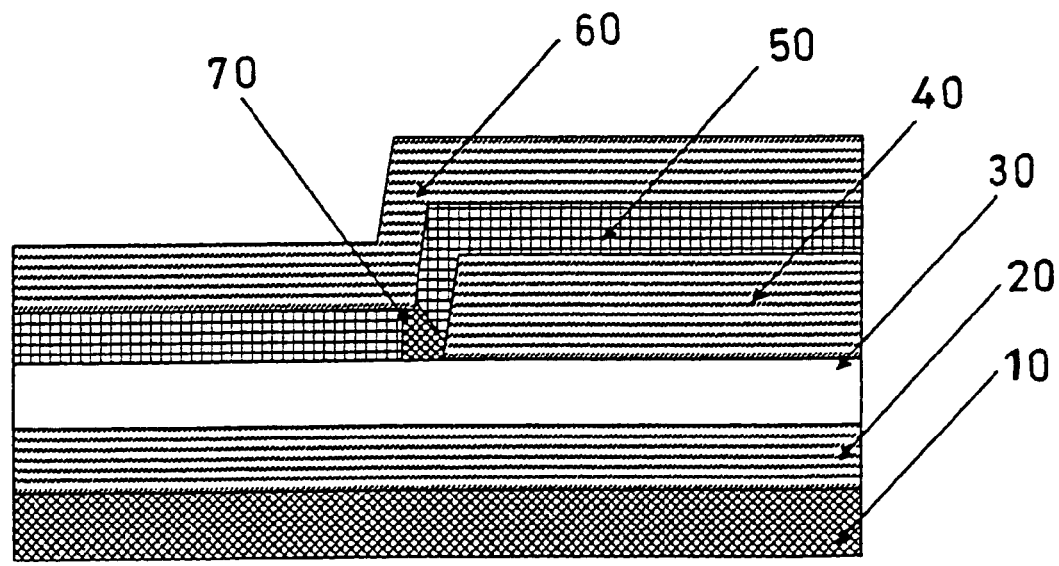
FIG. 2 is an enlarged cross-section of the principal portion of the transistor of FIG. 1.

That is, in an organic thin-film transistor, as shown in FIG. 1, having a gate electrode 20, an insulation layer 30, a source or drain 40, a semiconductor layer 50 and a drain or source 60 on a substrate 10, the thin-film transistor of the present invention comprises the gate electrode 20 provided on a portion of the substrate 10, the insulation layer 30 covering the gate electrode 20 and the substrate 10, the source or drain 40 provided on the insulation layer 30 in a region corresponding to the region of the gate electrode 20, the semiconductor layer 50 covering the source or drain 40 and the insulation layer 30, and the drain or source 60 formed on the semiconductor layer 50 in a region corresponding to the region of the source or drain 40 that overlaps with the gate electrode. FIG. 2 shows an enlargement of the principal portion of the structure of FIG. 1. In this transistor structure, by applying a bias from the gate electrode 20, a channel is formed in the semiconductor layer 50 in the upper part of the interface region in contact with the insulation layer 30, in a region adjacent to the source or drain 40. Thus, a region 70 between the source or drain 40 and the drain or source 60 becomes a channel region, the length of which (channel length) is defined by the film thickness of the semiconductor layer 50.

Figure 3:
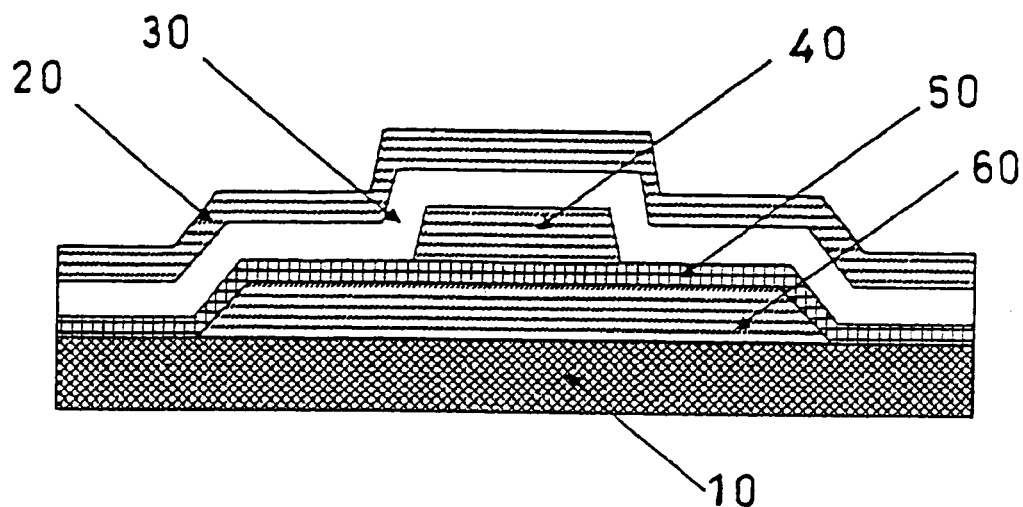
FIG. 3 is a typical cross section of another example of the organic thin-film transistor of the present invention.
Figure 4:
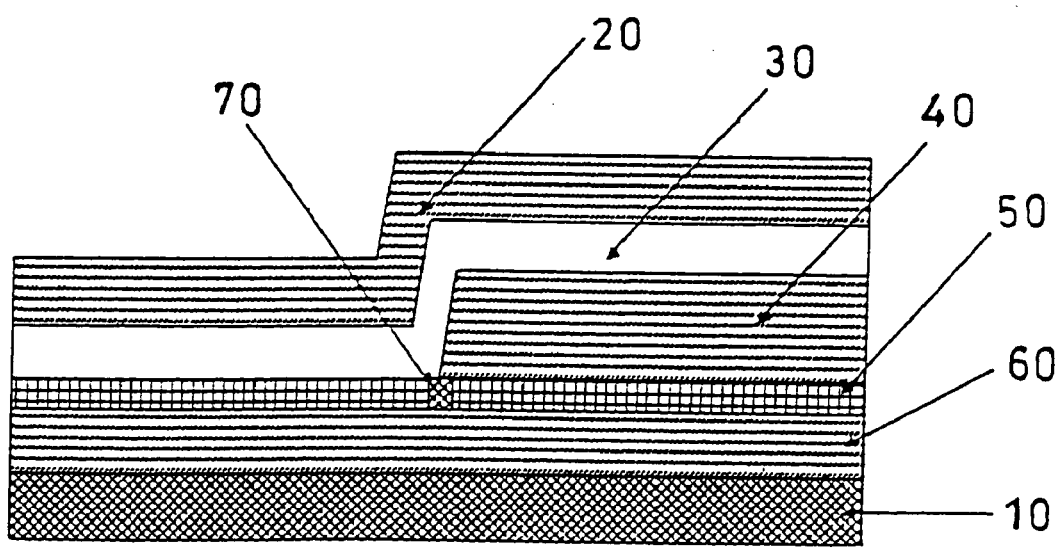
FIG. 4 is an enlarged cross section of the principal portion of the transistor of FIG. 3.

FIG. 3 shows another example of the thin-film transistor according to the present invention, which comprises a source or drain 60 provided on a portion of a substrate 10, a semiconductor layer 50 covering the source or drain 60 and the substrate 10, a drain or source 40 provided on the semiconductor layer 50 in a portion of a region corresponding to the region of the source or the drain 60, an insulation layer 30 covering the drain or source 40, and a gate electrode 20 provided on the insulation layer 30 in a region corresponding to a region of the drain or source 40 that overlaps with the source or drain 60. FIG. 4 shows an enlargement of the principal portion of the structure of FIG. 3. In this transistor structure, by applying a bias from the gate electrode 20, a channel is formed in the semiconductor layer 50 in the lower part of the interface region in contact with the insulation layer 30, in a region adjacent to the drain or source 40. Thus, a region 70 between the drain or source 40 and the source or drain 60 becomes a channel region, forming a channel 70 between the drain or source 40 and the source or drain 60, the length of which (channel length) is defined by the film thickness of the semiconductor layer 50.

Figure 5:
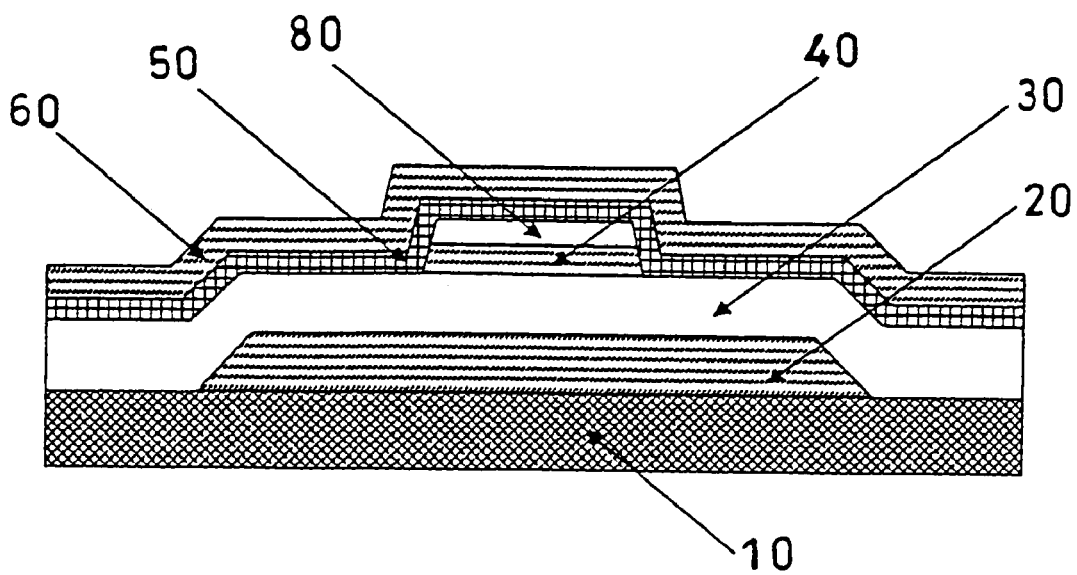
FIG. 5 is a typical cross section of an example of a device provided with an insulation film between the source and the drain of an organic thin-film transistor of the present invention.

Regarding the thin-film transistor according to the present invention, in the thin-film transistor of FIG. 1, an insulation layer 80 can be provided on top of the source or drain 40, as shown in FIG. 5.

There is no particular limitation on the material that may be employed for the substrate 10 used in the invention. Suitable materials that are generally used include substrate glass, such as quartz, and silicon wafer and the like, but substrates and the like formed of flexible plastic material, such as polycarbonate, polyimide and polyethylene terephthalate (PET) and the like can also be used. Regarding also the location of the substrate, there is no limitation as to whether it is located on the side of the gate electrode 20 opposite the insulation layer 30 side, or on the side of the source or the drain 60 opposite the semiconductor layer 50 side. When the gate electrode 20 is fabricated first, it is preferable to locate the substrate in contact with the gate electrode 20 on the opposite side to the insulation layer 30. When the source or drain 60 is fabricated first, it is preferable to locate the substrate in contact with the source or drain 60 on the opposite side to the semiconductor layer 50.

As the material of the gate electrode 20 used in the invention, there may be used any material having a low resistance value. Generally, metals, such as tungsten, chromium, silver, nickel, gold and copper and the like are most commonly used, but the invention is not limited to these. There is no particular limitation on the fabrication method thereof, any method being usable. The method generally used is plated interconnections and the like, but wet-type manufacturing processes and the like using the printing techniques of typographic printing, screen printing and inkjet printing that involve coating or affixment of solutions can also be adopted. In this case, for the gate electrode 20, in addition to silver paste, it is possible to use an electrode of thiophene based conductive polymer (PEDOT), polyaniline and derivatives thereof and other such organic materials. It is also possible to adapt manufacturing processes that are of dry type, unlike the above processes, such as the vacuum deposition method and the sputtering method and the like. For device stability, long life, high charge-injection efficiency and the like, the gate electrode 20 can also be composed of a mixture or lamination of a plurality of materials, or subjected to surface treatment.

There is no particular limitation on the profile of the gate electrode 20 used in the invention, any profile being usable. A suitable profile that is generally used is that of a straight interconnection that is from not less than 1-μm to not more than 1-mm wide and from not less than 20-nm to not more than 10-μm thick, but this is not limitative.

For the insulation layer 30 in contact with the gate electrode used in the invention, it is preferable to use a material having a high permittivity in order to obtain a more effective electric field effect. Examples that can be mentioned include $SiO_2$ and $Al_2O_3$, but these are not limitative, it being also possible to use a polymer dielectric, such as polymethyl methacrylate (PMMA), polyimide, polystyrene, polyparaxylene, polyvinylidene fluoride (PVF), polyvinylphenol and pullulan and the like to impart flexibility to the device. It is also possible to use a ferroelectric substance, such as titanate zirconate (PZT) and the like. It is also possible to enlarge the crystal grain of the semiconductor thin-film 50, coat the surface of the insulation layer 30 on the semiconductor layer 50 side to increase the orientation, subject the surface of the insulation layer 30 to orientation treatment, and so forth.

There is no particular limitation on the method used to fabricate the insulation layer 30 used in the invention, any method being usable. Generally, the most commonly used method is vacuum deposition, sputtering or other such vapor phase epitaxy method. From the point of ease and low cost of fabrication, screen printing, inkjet printing and other such printing techniques used in wet-type manufacturing processes and the like and involving coating or affixment of solutions that are mixtures of materials and solvents, are also used for fabrication. The layer thickness that can generally be used is between not less than 50 nm and not more than 5000 nm, preferably between not less than 100 nm and not more than 500 nm.

There is no particular limitation on the profile of the insulation layer 30 used in the invention that is in contact with the gate electrode, any profile being usable. In general, it is preferable to use a profile having an area larger than the semiconductor layer 50.

For one of the source and the drain (electrode) 40 or 60, there is used a material having a high work function, such as gold, platinum, palladium, copper, nickel, indium-tin oxide and polythiophene, or materials that are a combination of a plurality thereof, and for the other there is used a material having a low work function, such as indium, aluminum, silver, calcium, magnesium and lithium, or materials that are a combination of a plurality thereof. To adjust the work function and for device stability, long life, high charge-injection efficiency and the like, the source and the drain can also be composed of a mixture or lamination of a plurality of materials, or surface treatment can be applied and the interface with the semiconductor layer modified.

Furthermore, by composing the source and the drain of materials having different work functions, as described above, a barrier is formed between one of the source and the drain (electrode) and the semiconductor layer, making it possible to decrease the leakage current between the source and the drain.

There is no particular limitation on the method used to fabricate the source or the drain 40 or 60 used in the invention, any method being usable. Generally, the most commonly used method is vacuum deposition, sputtering or other such vapor phase epitaxy method. From the point of ease and low cost of fabrication, screen printing, inkjet printing and other such printing techniques are also used, which are used in wet-type manufacturing processes and the like and involve coating or the like of solutions that are mixtures of materials and solvents.

There is no particular limitation on the pattern profile of the source or the drain 40 or 60 used in the invention, any profile being usable. A suitable profile that is generally used is that of a straight interconnection that is from not less than 1-μm to not more than 1-mm wide and from not less than 20-nm to not more than 10-μm thick, but this is not limitative.

Figure 6:
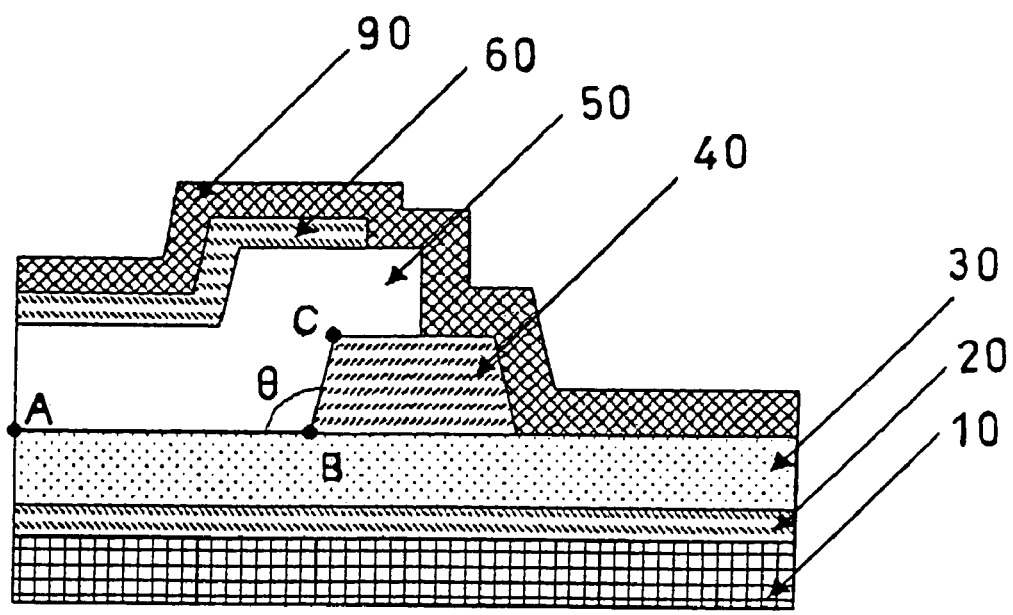
FIG. 6 is a typical cross-section of an example of a device having the source or drain profile of the present invention.

In order to achieve an effective electric field distribution, it is preferable for the source or drain 40 used in the invention to have a cross-sectional profile in which the angle θ formed between the film surface of the insulation layer 30 (surface A-B in FIG. 6) and the side surface of the source or drain 40 (surface B-C in FIG. 6) is not more than 130 degrees. For increased effectiveness, it is preferable to make the angle θ as close as possible to 90 degrees.

Figure 7:
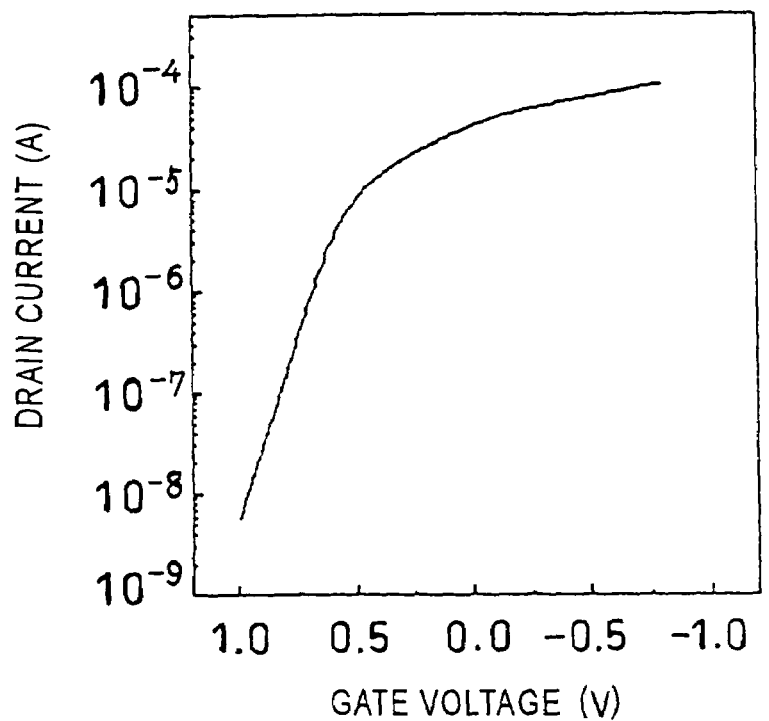
FIG. 7 is a diagram showing the gate voltage dependency of the drain current at a drain voltage of 4 V in an organic thin-film transistor in which θ=approximately 120°.

FIG. 7 shows the gate voltage dependency of the source-drain current at a source-drain voltage of 4 V in a device in which the above θ is approximately 120°. The figure shows the sub-threshold slope obtained at a source-drain voltage of 4 V was approximately 0.15 V/decade.

Figure 8:
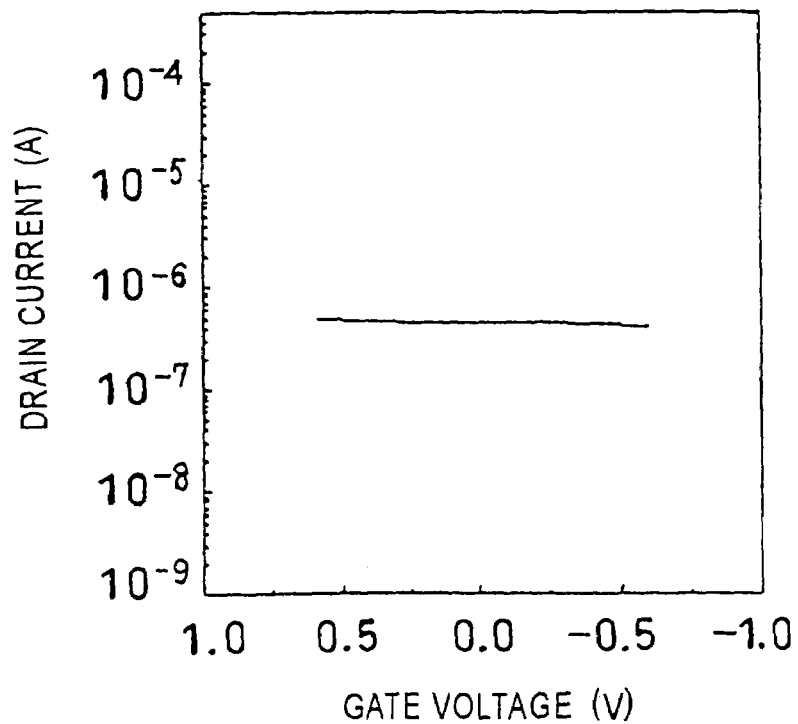
FIG. 8 is a diagram showing the gate voltage dependency of the drain current at a drain voltage of 4 V in an organic thin-film transistor in which θ=approximately 150°.

FIG. 8 is a diagram showing the gate voltage dependency of the source-drain current at a source-drain voltage of 4 V in a device in which the above θ is approximately 150°. The figure reveals that even when the gate voltage is changed, there is almost no change in the drain current, so there is no manifestation of a gate-electrode-based modulation effect.

There is no particular limitation on the method used to fabricate such a profile, any method being usable. Generally, the profile is formed using photo-etching technology, mask vacuum-deposition and the like. Particularly in cases where a coating method is used, such as an inkjet method or the like, depending on the electrode material and the drying conditions, it may happen that the angle θ formed between the film surface of the insulation layer 30 and the side surface of the source or drain 40 is 90 degrees or less, but this does not matter.

With respect to the location of the gate electrode 20, the source or drain 40 and the drain or source 60 in the invention, in making the interconnections, there is no particular limitation on the mutual angles of the axes thereof on the substrate plane, so interconnections can be made at any angle. However, it is necessary to have a portion of intersection among the gate electrode 20, the source or drain 40 and the drain or source 60. Also, at portions of each that are outside the device portions, it is preferable to use locations where there is no overlap in the vertical direction.

The thin-film transistor of the invention uses organic semiconductor material for the semiconductor layer 50. There is no particular limitation on the composition thereof. It can be composed of a single substance or of a mixture of a plurality of substances. It can also be configured as a layered structure of a plurality of substances. The following are organic semiconductor materials that are known as having displayed superior characteristics:

Athracene, tetracene, pentacene and derivatives thereof each with its terminal substituted; α-sexithiophene, perylene tetracarboxylic dianhydride (PTCDA) and derivatives thereof each with its terminal substituted; naphthalene tetracarboxylic dianhydride (NTCDA) and derivatives thereof each with its terminal substituted; copper phthalocyanine and derivatives thereof each with its terminal substituted with fluorine and the like; derivatives of copper phthalocyanin in which nickel, titanium oxide or fluorinated aluminum is substituted for the copper, and derivatives thereof each with its terminal substituted with fluorine and the like; fullerene, rubrene, coronene, anthra-dithiophene and derivatives thereof each with its terminal substituted; and polyphenylene vinylene, polythiophene, polyfluorene, polyphenylene, polyacetylene and polymers of derivatives thereof each with its terminal or side-chain substituted.

More specifically, in cases where the semiconductor layer 50 is formed of a p-type organic semiconductor material, it is preferable that whichever of the source or the drain 40 that is nearer to the gate electrode 20 be composed of a material having a high work function and whichever of the source or the drain 60 that is further from the gate electrode 20 be composed of a material having a low work function.

For the above p-type semiconductor, there may be used pentacene, tetracene, thiophene, phthalocyanine or derivatives thereof each with its terminal substituted, as well as polythiophene, polyphenylene, polyphenylene vinylene, polyfluorene or polymers of derivatives thereof each with its terminal or side-chain substituted.

In cases where the semiconductor layer 50 is formed of an n-type organic semiconductor material, it is preferable that whichever of the source or the drain 40 that is nearer to the gate electrode 20 be composed of a material having a low work function and whichever of the source or the drain 60 that is further from the gate electrode 20 be composed of a material having a high work function.

For the above n-type semiconductor, there may be used perylene tetracarboxylic dianhydride, naphthalene tetracarboxylic dianhydride, fluorinated phthalocyanin or derivatives thereof each with its terminal substituted.

There is no particular limitation on the method used to fabricate the semiconductor layer 50 used in the invention, any method being usable. Generally, the most commonly used method is vacuum deposition or other such vapor phase epitaxy method. From the point of ease and low cost of fabrication, screen printing, inkjet printing and other such printing techniques and the like are also used for fabrication, which are used in wet-type manufacturing processes and the like and involve coating or affixment of solutions that are mixtures of materials and solvents. It is also possible to adapt microcontact printing, micromodelling and other printing methods referred to as soft lithography.

The thickness of the semiconductor layer 50 of the invention controls the channel length. The thinner the thickness, the higher the performance that can be imparted is. The thickness generally used is not more than 1 μm, and preferably is from not more than 0.5 μm to 0.05 μm or more. The material of which the semiconductor layer 50 is composed can be given an amorphous structural form to maintain the uniform quality of the film thickness. The semiconductor layer 60 can be formed through distributing organic material in an amorphous high-polymer medium.

There is no particular limitation on the profile of the semiconductor layer 50 used in the invention, any profile being usable. In general, a profile having an area larger than the portion of intersection between the source or drain 40 and the drain or source 50 is sought.

When an insulation layer 80 is inserted into the transistor device of this invention, as shown in FIG. 5, it can be narrower than the source or drain 40, but preferably the width thereof should be close to a width that does not exceed the width of the source or drain 40.

The position at which the insulation layer 80 of the invention is inserted is on the source or drain 40, but there is no particular limitation on the positional relationship with the semiconductor layer 50. It can be on the source or drain 40 and under the semiconductor layer 50, or located at a region positioned above the source or drain 40, between the semiconductor layer 50 and the drain or source 60. In width, the insulation layer can be narrower than the source or drain 40, but preferably the width thereof should be close to a width that does not exceed the width of the source or drain 40. The insulation layer can be located both between the source or drain 40 and the semiconductor layer 50 and between the semiconductor layer 50 and the drain or source 60.

Preferably, the material of the insulation layer 80 should be a material having effective insulation properties. Examples include $SiO_2$ and $Al_2O_3$, but these are not limitative, it being also possible to use a polymer dielectric, such as polymethyl methacrylate (PMMA), polyimide, polyethylene, polystyrene, polyparaxylene, polyvinylidene fluoride (PVF), polyvinylphenol and the like to impart flexibility to the device. It is also possible to enlarge the crystal grain of the semiconductor thin-film 50, and increase the orientation by subjecting the surface of the insulation layer 80 to orientation treatment, putting a coating on the semiconductor layer 80, and so forth.

There is no particular limitation on the method used to fabricate the insulation layer 80 of the invention, any method being usable. Generally, the most commonly used method is vacuum deposition, sputtering or other such vapor phase epitaxy method. From the point of ease and low cost of fabrication, screen printing, inkjet printing and other such printing techniques and the like are also used for fabrication, which are used in wet-type manufacturing processes and the like and involve coating or affixment of solutions that are mixtures of materials and solvents. The layer thickness that can generally be used is from not less than 0 nm to not more than 5000 nm, and preferably from not less than 50 nm to not more than 500 nm.

Figure 9:
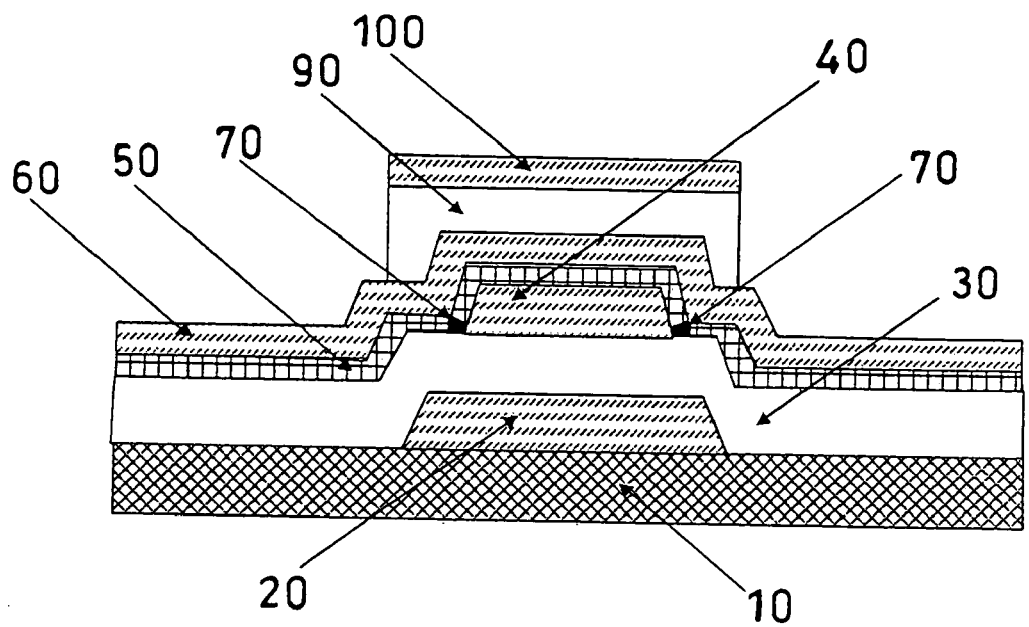
FIG. 9 is a typical cross section of an example of a display device fabricated using the thin-film transistor of the present invention.

The thin-film transistor of the invention, configured as described in the above, can be used to fabricate a display device. As shown in FIG. 9, for example, a display device can be fabricated by disposing a display portion 90 together with a top electrode 100 on the drain or source 60 of the thin-film transistor of the invention, on the thin-film transistor or on the end portion of the thin-film transistor. The display portion 90 of this display device forms an electroluminescent device, a liquid crystal device or an electrophoresis device.

Figure 10:
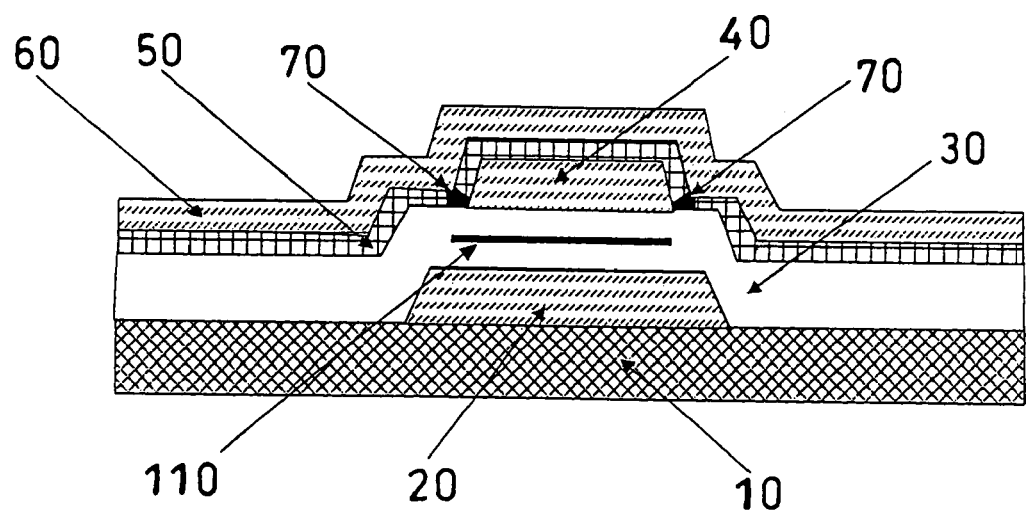
FIG. 10 is a typical cross section of an example of a memory device fabricated using the thin-film transistor of the present invention.
Figure 11:
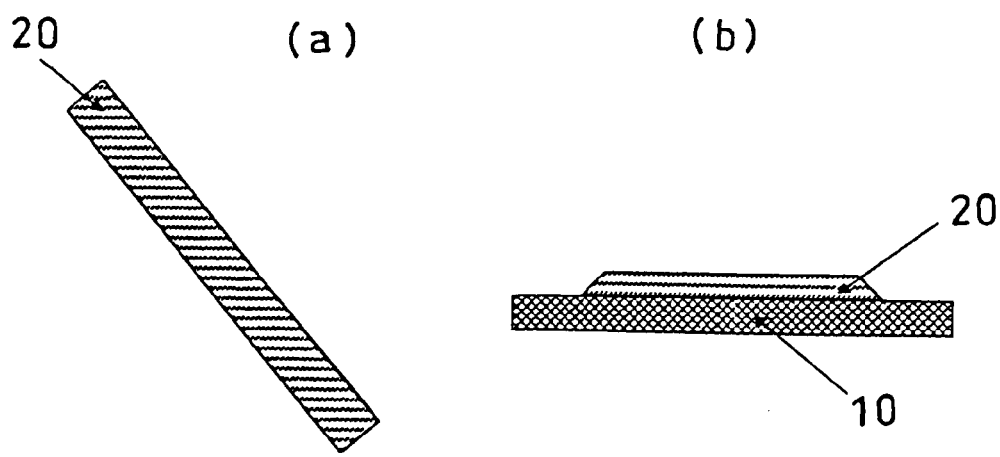
FIG. 11 to FIG. 15 show the manufacturing processes used to form an organic thin-film transistor according to the present invention.

Also, using ferroelectric material for all or part of the insulation layer 30 of the thin-film transistor of the invention makes it possible to fabricate a ferroelectric memory device. In this case, as shown in FIG. 10, a floating memory device can be fabricated by introducing a floating gate electrode 110 into the interior of the insulation layer 30.

The thin-film transistor of the invention can also be used to form an integrated circuit by interconnecting a plurality of combined types on a flat plane. By combining a plurality of thin-film transistor devices that use an n-type organic semiconductor and thin-film transistor devices that use a p-type organic semiconductor, a complementary integrated circuit can be formed.

Further details of the invention are described below using Examples. However, the invention is not limited to these Examples.

EXAMPLE 1

Figure 12:
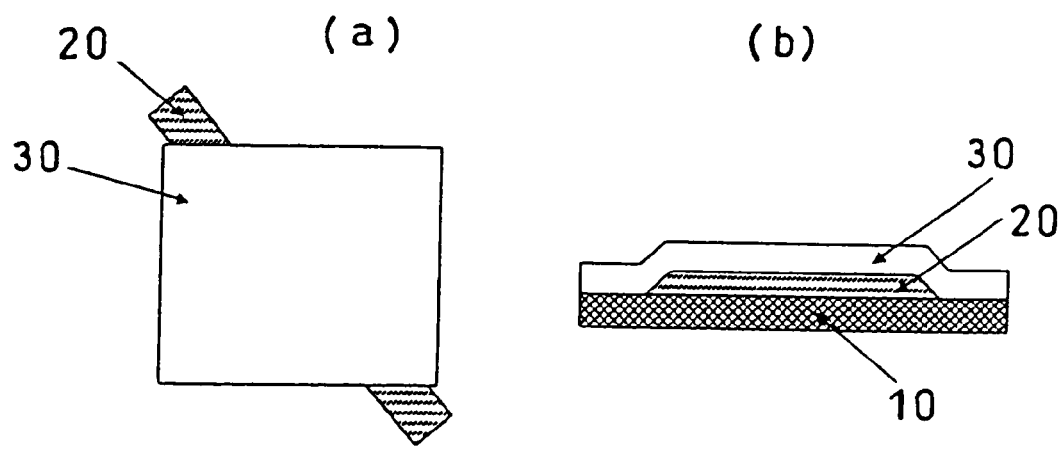
Figure 13:
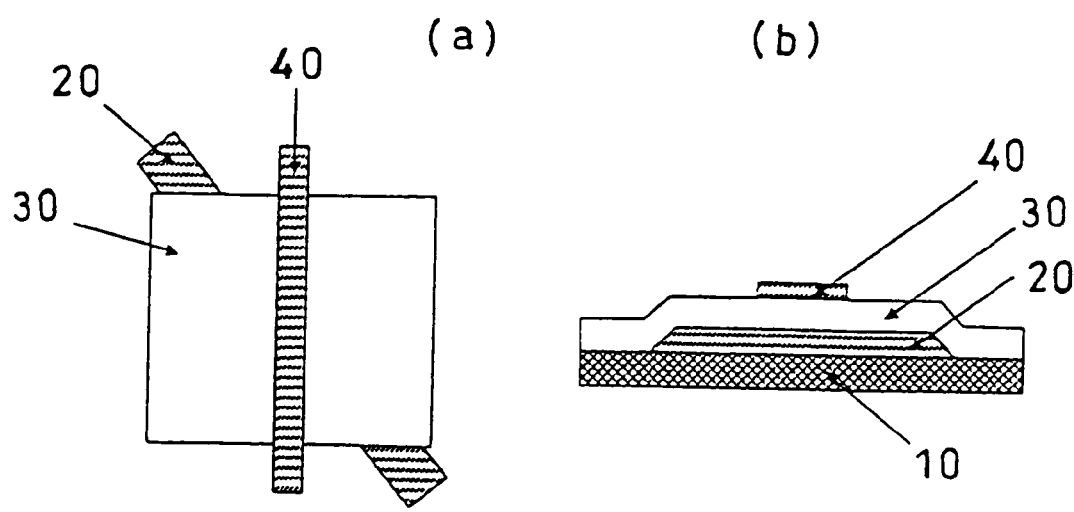
Figure 14:
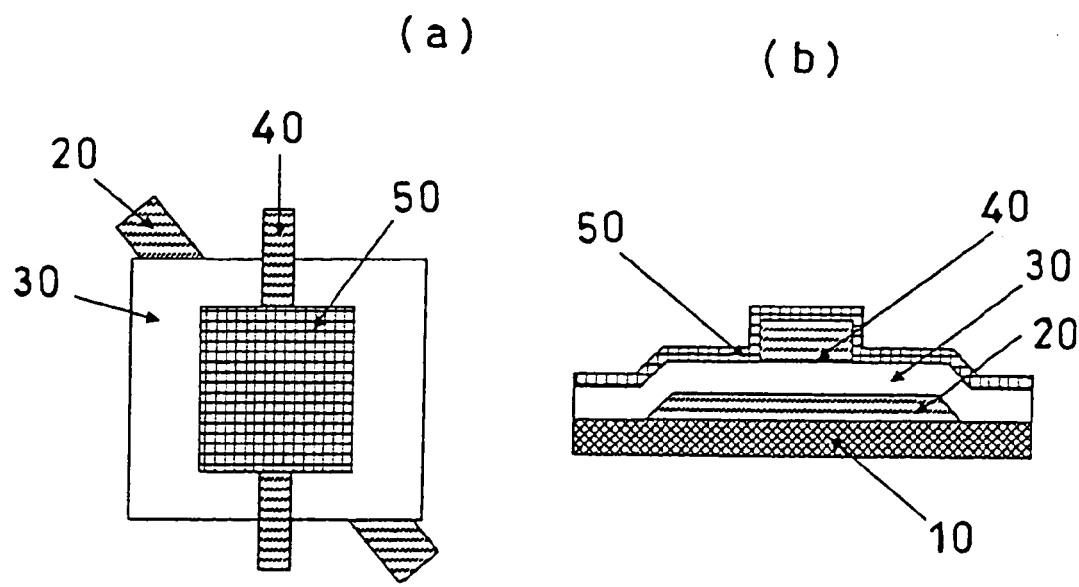
Figure 15:
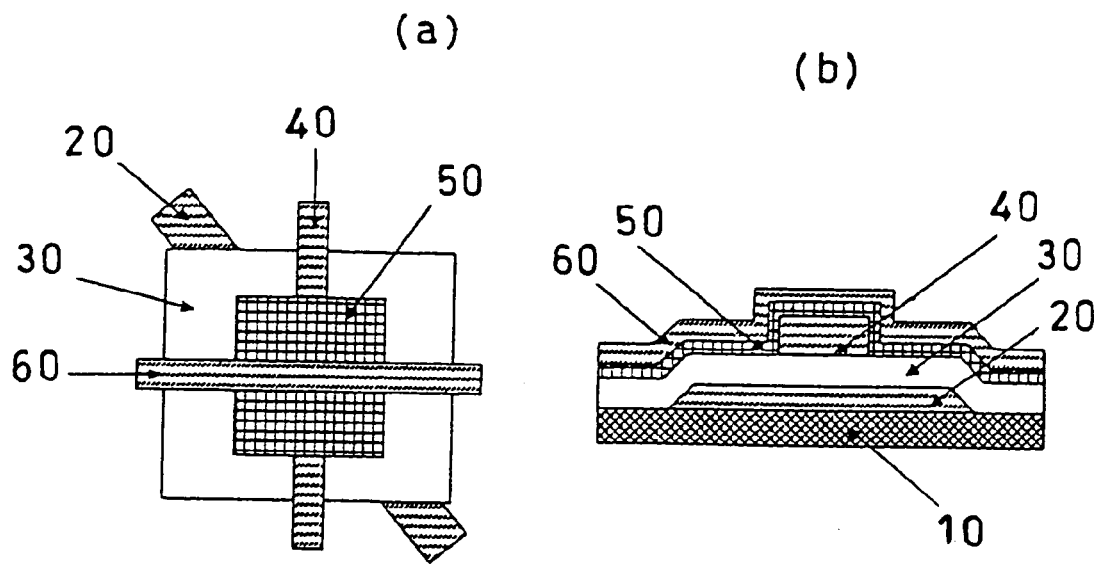

A substrate (area: 20×35 mm, thickness: 1.0 mm) of synthetic quartz (ES grade) was subjected to 20 minutes of ultrasonic washing with a neutral detergent (PureSoft produced by Iuchi Seieidou Co.) diluted five-fold with pure water, followed by 20 minutes of ultrasonic washing in pure water to remove the detergent. An ultraviolet light-ozone washing device was then used to wash the substrate for 20 minutes by irradiating it with ultraviolet light in an oxygen atmosphere. A nickel mask was then utilized to vacuum-deposit gold onto the quartz substrate thus washed to form a gate electrode 20 that was 100-µm wide and 0.2-µm thick. The film formation conditions at this time were a deposition rate of 6 nm a minute with the substrate at 30° C. Next, as shown in FIG. 12, polymethyl methacrylate (PMMA) was dissolved in chloroform and the solution was used to form on the top of the gate electrode 20 the insulation layer 30 as a layer 0.4-µm thick, using the spin-coating method. Then, as shown in FIG. 13, on the top of the insulation layer 30, a nickel mask was utilized to vacuum-deposit gold to form a drain (electrode) 40 that was 100-µm wide and 0.2-µm thick. The film formation conditions at this time were a deposition rate of 6 nm a minute at a substrate temperature of 30° C. The drain 40 was arranged so that it only overlapped a part of the previously formed gate electrode 20 and the axis of the gate electrode 20 and the axis of the drain 40 were parallel. Next, as shown in FIG. 14, pentacene was vacuum-deposited to form semiconductor layer 50 on the drain. Refined pentacene was used that had been sublimation-refined ten times. Regarding vacuum deposition conditions, the substrate was fixed over the deposition boat, the substrate temperature was adjusted to about 30° C. and the pressure was reduced to a vacuum of $2\times10^{-6}$ Torr. Following that, vacuum deposition was carried out to a thickness of 0.5 µm at a rate of 1 nm a minute. Following that, a nickel mask was utilized to vacuum-deposit gold to form a source (electrode) 60 that was 100-µm wide and 0.05-µm thick. The film was formed so that the lengthwise axis of the source 60 was orthogonal to the lengthwise axis of the drain 40 and was not parallel to the axis of the gate electrode 20. The film formation conditions at this time were a deposition rate of 6 nm a minute at a substrate temperature of 30° C. In this way, a field-effect type thin-film transistor was formed with a channel length of 0.5 µm and a channel width of 100 µm.

EXAMPLE 2

Figure 16:
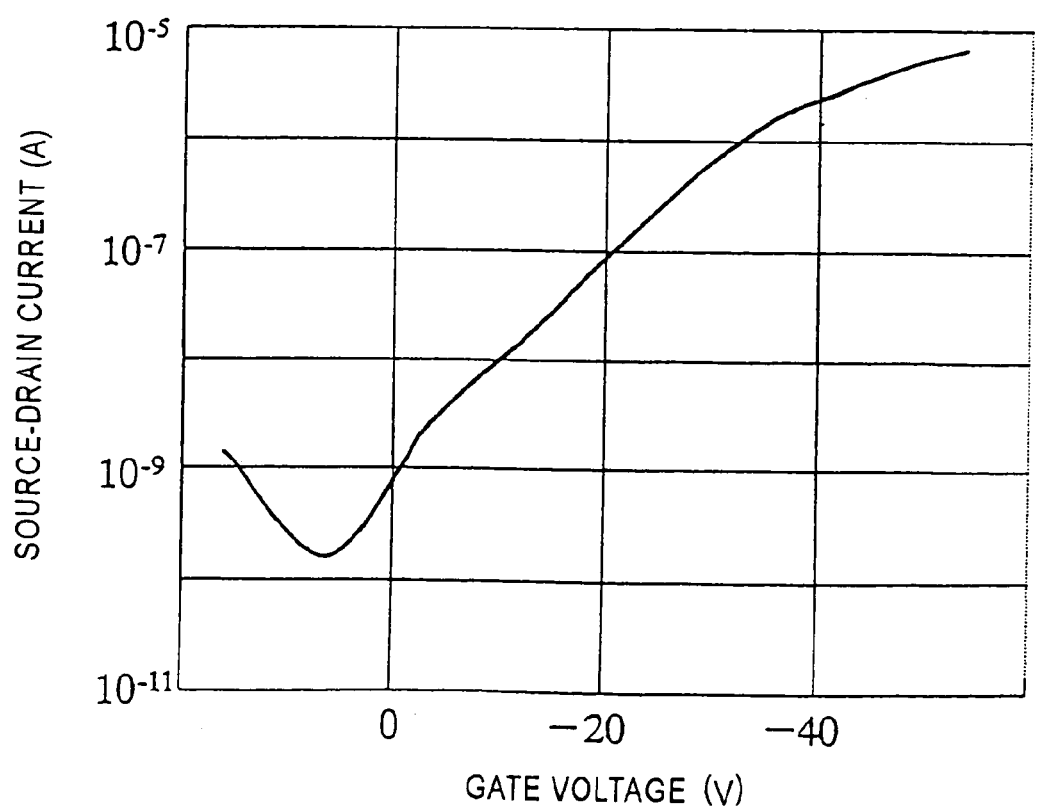
FIG. 16 is a diagram showing the gate voltage dependency of the source-drain current in a transistor obtained in Example 2.

An n-type silicon substrate (area: 20×35 mm, thickness: 1.0 mm) on which a 300-nm thermally oxidized silicon film was grown to form an insulation layer 30, was subjected to 20 minutes of ultrasonic washing with a neutral detergent (PureSoft produced by Iuchi Seieidou Co.) diluted five-fold with pure water, followed by 20 minutes of ultrasonic washing in pure water to remove the detergent. An ultraviolet light-ozone washing device was then used to wash the substrate for 20 minutes by irradiating it with ultraviolet light in an oxygen atmosphere. A nickel mask was then utilized to vacuum-deposit onto the substrate thus washed, a gold drain 40 that was 100-µm wide and 0.2-µm thick. The film formation conditions at this time were a deposition rate of 6 nm a minute at a substrate temperature of 30° C. On the top thereof, for the semiconductor layer 50, the vacuum-deposition method was used to form a pentacene thin-film. Refined pentacene was used that had been sublimation-refined ten times. Regarding vacuum deposition conditions, the substrate was fixed over the deposition boat, the substrate temperature was adjusted to about 45° C. and the pressure was reduced to a vacuum of $2\times10^{-6}$ Torr. Following that, vacuum deposition was carried out to a thickness of 0.5 µm at a rate of 1 nm a minute. Following that, a nickel mask was utilized to vacuum-deposit indium to form on the semiconductor layer a source 60 that was 100-µm wide and 0.2-µm thick, arranged so that the lengthwise direction thereof was orthogonal to the lengthwise direction of the drain 40. The film formation conditions at this time were a deposition rate of 6 nm a minute at a substrate temperature of 30° C. The silicon wafer used for the substrate was used for the gate electrode 20. The thin-film transistor thus fabricated functioned as a field-effect type thin-film transistor with a channel length of 0.5 µm and a channel width of 100 µm. FIG. 16 shows the gate voltage dependency of the source-drain current at a source-drain voltage of 2 V in the device thus fabricated. The figure shows the sub-threshold slope obtained at a source-drain voltage of 2 V was approximately 8 V/decade.

EXAMPLE 3

Figure 17:
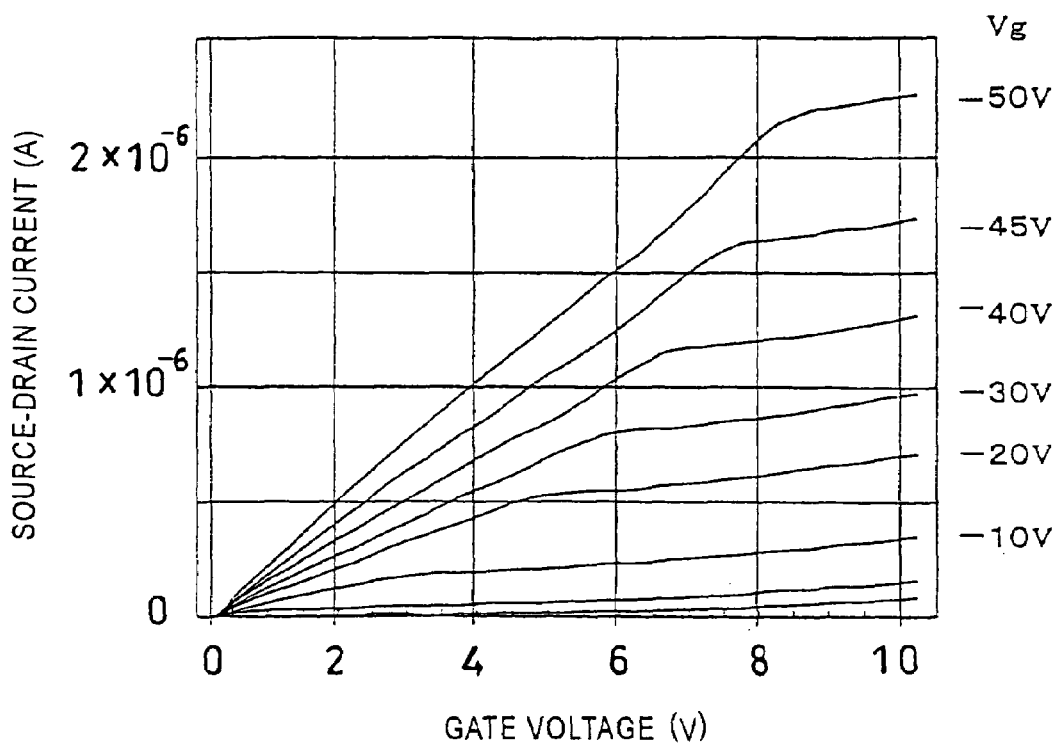
FIG. 17 is a diagram showing the source-drain voltage dependency of the source-drain current with the gate electrode at −10 V to −50 V in a transistor obtained in Example 3.

An n-type silicon substrate (area: 20×35 mm, thickness: 1.0 mm) on which a 300-nm thermally oxidized silicon film was grown to form an insulation layer 30, was subjected to 20 minutes of ultrasonic washing with a neutral detergent (PureSoft produced by Iuchi Seieidou Co.) diluted five-fold with pure water, followed by 20 minutes of ultrasonic washing in pure water to remove the detergent. An ultraviolet light-ozone washing device was then used to wash the substrate for 20 minutes by irradiating it with ultraviolet light in an oxygen atmosphere. A nickel mask was then utilized to vacuum-deposit onto the substrate thus washed, a gold drain 40 that was 100-µm wide and 0.2-µm thick. The film formation conditions at this time were a deposition rate of 6 nm a minute at a substrate temperature of 30° C. On the top thereof, for the semiconductor layer 50, the vacuum-deposition method was used to form a pentacene thin-film. Refined pentacene was used that had been sublimation-refined ten times. Regarding vacuum deposition conditions, the substrate was fixed over the deposition boat, the substrate temperature was adjusted to about −190° C. and the pressure was reduced to a vacuum of $2\times10^{-6}$ Torr. Following that, vacuum deposition was carried out to a thickness of 0.5 µm at a rate of 1 nm a minute. The pentacene thus fabricated was in an amorphous structural form. Following that, a nickel mask was utilized to vacuum-deposit indium thereon to form a source 60 that was 100-µm wide and 0.2-µm thick, arranged so that the lengthwise direction thereof was orthogonal to the lengthwise direction of the drain 40. The film formation conditions at this time were a deposition rate of 6 nm a minute at a substrate temperature of 30° C. The silicon wafer used for the substrate was used for the gate electrode 20. The thin-film transistor thus fabricated functioned as a field-effect type thin-film transistor with a channel length of 0.5 µm and a channel width of 100 µm. FIG. 17 shows the source-drain voltage dependency of the source-drain current at various gate voltages in the device thus fabricated. The source-drain current shown in the figure is after subtracting the leakage current at a source-drain voltage of 0 V. This shows that even when the gate voltage was increased to −50 V, a saturation region appeared at a source-drain voltage of 10 V or below.

EXAMPLE 4

Figure 18:
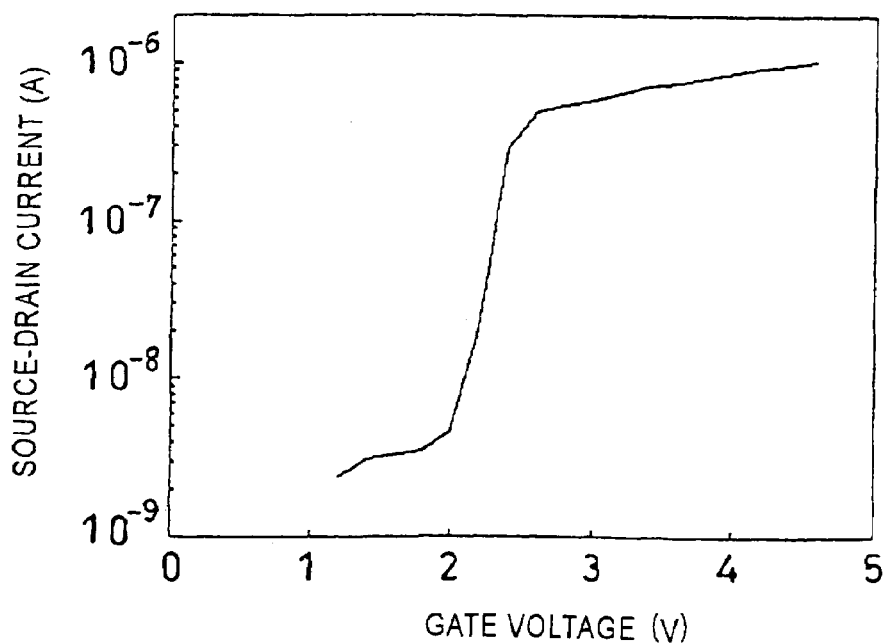
FIG. 18 is a diagram showing a correlation curve of drain current and gate voltage at a drain voltage of 4 V in a transistor obtained in Example 4.

An n-type silicon substrate was subjected to 20 minutes of ultrasonic washing with a neutral detergent (PureSoft produced by Iuchi Seieidou Co.) diluted five-fold with pure water, followed by 20 minutes of ultrasonic washing in pure water to remove the detergent. An ultraviolet light-ozone washing device was then used to wash the substrate for 20 minutes by irradiating it with ultraviolet light. A nickel mask was then utilized to vacuum-deposit onto the substrate thus washed, a gold drain 100-µm wide and 0.1-µm thick. The film formation conditions at this time were a deposition rate of 6 nm a minute at a substrate temperature of 30° C. A scanning electron microscope was used to observe the side face of the electrode thus formed and the scanning electron microscope image was used to find the angle formed between the side face of the electrode and the surface of the insulation layer, which was found to be about 120 degrees. Polymethyl methacrylate (PMMA) was dissolved in chloroform and the solution was used to form on the drain an insulation layer as a layer 0.4-µm thick, using the spin-coating method. Then, on the top of the insulation layer, a chloroform solution was used to form a thin-film coating of poly-3-hexyl thiophene. The film thickness was 1 µm. Gold was then vacuum-deposited to form on the coating a source 100-µm wide and 0.1-µm thick, with the lengthwise direction thereof orthogonal to the lengthwise direction of the drain. The film formation conditions at this time were a deposition rate of 6 nm a minute at a substrate temperature of 30° C. The silicon wafer used for the substrate was used for the gate electrode 20. FIG. 18 shows the gate voltage dependency of the source-drain current at a source-drain voltage of 4 V in the device thus fabricated. The sub-threshold slope was 0.2 V/decade.

EXAMPLE 5

Figure 19:
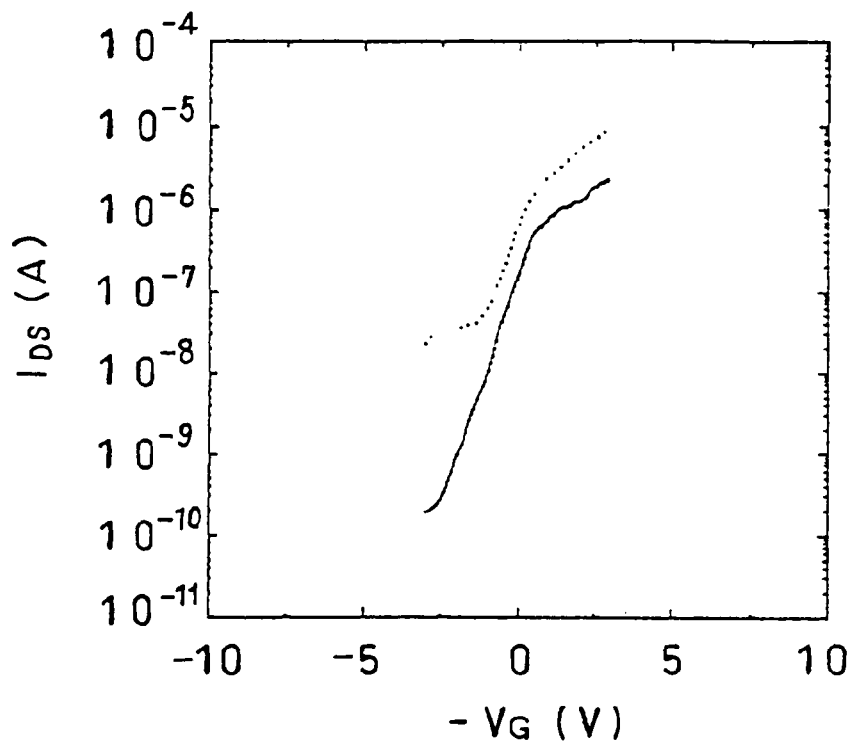
FIG. 19 shows drain current—gate voltage curves of a device obtained in Example 5, with the solid line showing when gold was used for the source and indium for the drain, and the dotted line showing when gold was used for both the source and the drain.

An n-type silicon substrate on which a 300-nm thermally oxidized silicon film was grown to form an insulation layer was subjected to 20 minutes of ultrasonic washing with a neutral detergent (PureSoft produced by Iuchi Seieidou Co.) diluted five-fold with pure water, followed by 20 minutes of ultrasonic washing in pure water to remove the detergent. An ultraviolet light-ozone washing device was then used to wash the substrate for 20 minutes by irradiating it with ultraviolet light. A gold drain 100-µm wide and 0.1-µm thick was then vacuum-deposited onto the substrate thus washed. The film formation conditions at this time were a deposition rate of 6 nm a minute at a substrate temperature of 30° C. A scanning electron microscope was used to observe the side face of the electrode thus formed and the scanning electron microscope image was used to find the angle formed between the side face of the electrode and the surface of the insulation layer, which was found to be about 120 degrees. The substrate on which the gold electrode was formed was subjected to surface hydrophobic treatment by immersion for 10 minutes in a chloroform solution of octadecyl trichlorosilane. The vacuum-deposition method was then used to form thereon a pentacene thin-film constituting a p-type semiconductor layer. Refined pentacene was used that had been sublimation-refined ten times. Regarding vacuum deposition conditions, the substrate was fixed over the deposition boat, the substrate temperature was adjusted to about 45° C. and the pressure was reduced to a vacuum of $2\times10^{-6}$ Torr. Following that, vacuum deposition was carried out to a thickness of 500 nm at a rate of 1 nm a minute. Following that, gold was vacuum-deposited thereon to form a source 100-µm wide and 0.1-µm thick, arranged so that the lengthwise direction thereof was orthogonal to the lengthwise direction of the drain. The film formation conditions at this time were a deposition rate of 6 nm a minute at a substrate temperature of 30° C. The silicon wafer used for the substrate was used for the gate electrode. The thin-film transistor thus fabricated functioned as a field-effect type thin-film transistor with a channel length of 0.5 µm and a channel width of 100 µm. FIG. 19 shows the gate voltage dependency of the source-drain current at a source-drain voltage of 4 V in the device thus fabricated, shown as a dotted line. The sub-threshold slope was 0.15 V/decade, and the Off-current was on the $10^{-8}$ A level. A device was fabricated in exactly the same way, using indium for the source. Vacuum deposition was used to form the indium 100-µm wide and 0.1-µm thick, with the lengthwise direction thereof orthogonal to the lengthwise direction of the drain. The film formation conditions at this time were a deposition rate of 6 nm a minute at a substrate temperature of 30° C. The thin-film transistor thus fabricated functioned as a field-effect type thin-film transistor with a channel length of 0.5 µm and a channel width of 100 µm. FIG. 19 shows the gate voltage dependency of the source-drain current at a source-drain voltage of 4 V in the device thus fabricated, shown as a solid line. The sub-threshold slope was 0.2 V/decade and the Off-current was on the $10^{-10}$ A level. When a device was fabricated in exactly the same way in which both the source and drain electrodes were formed of gold when fabricated after the insulation layer, and of indium when fabricated after the semiconductor layer, compared to when both electrodes were formed of gold, the sub-threshold slopes showed substantially the same values but the Off-current was more than two digits lower.

EXAMPLE 6

Figure 20:
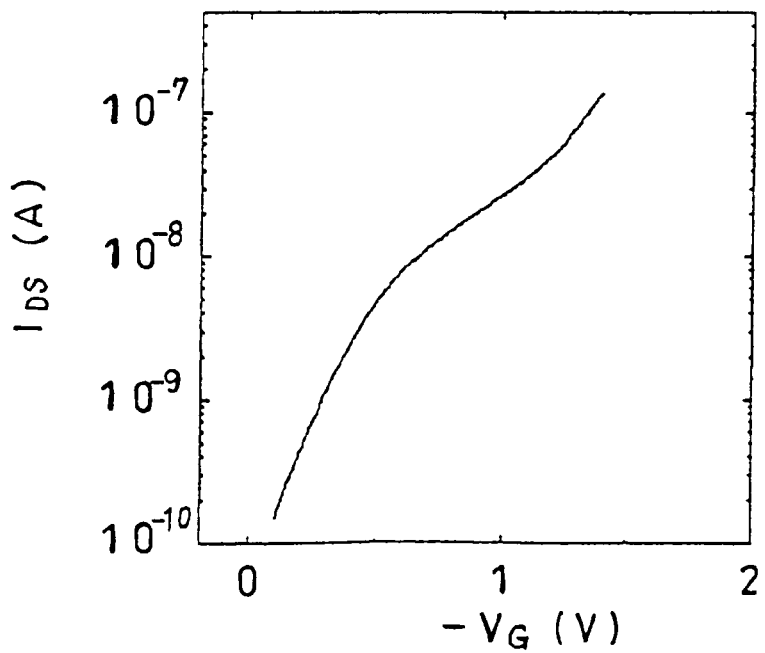
FIG. 20 shows a drain current—gate voltage curve of a device obtained in Example 6.
Figure 21:
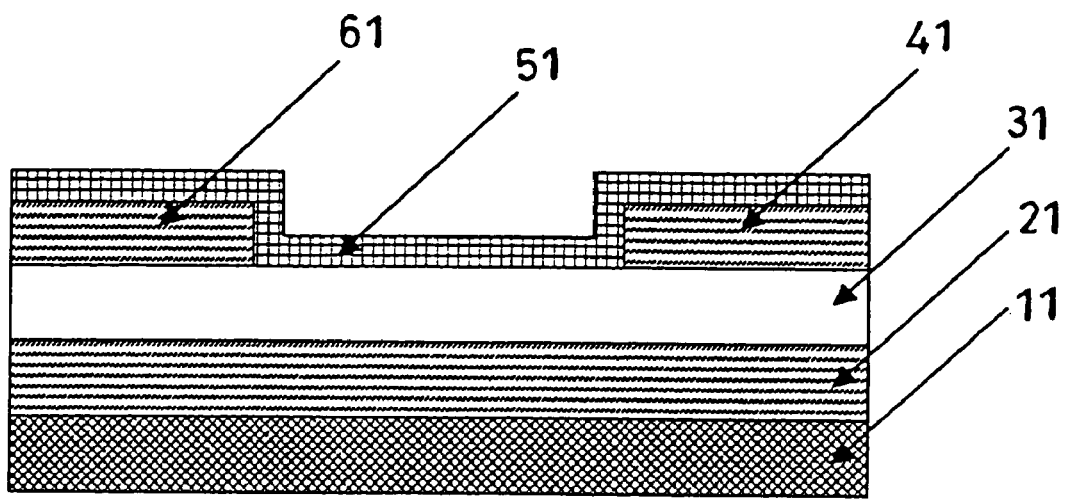
FIG. 21 is a typical cross section of a device structure called a bottom contact structure, in a conventional organic thin-film transistor.
Figure 22:
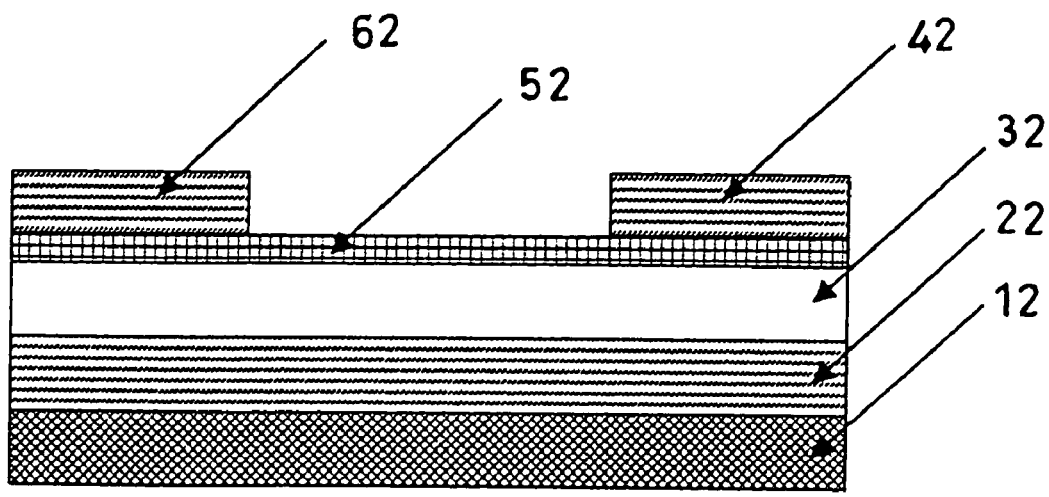
FIG. 22 is a typical cross section of a device structure called a bottom contact structure, in a conventional organic thin-film transistor.

An n-type silicon substrate on which a 50-nm thermally oxidized silicon film was grown to form an insulation layer was ultrasonically washed with a neutral detergent (PureSoft produced by Iuchi Seieidou Co.) diluted with pure water, which was followed by ultrasonic washing in pure water to remove the detergent. An ultraviolet light-ozone washing device was then used to wash the substrate for 20 minutes by irradiating it with ultraviolet light. An aluminum drain 100-μm wide and 0.1-μm thick was then vacuum-deposited onto the substrate thus washed. The film formation conditions at this time were a deposition rate of 6 nm a minute at a substrate temperature of 30° C. The vacuum-deposition method was then used to form thereon a methyl perylene thin-film constituting an n-type semiconductor. Regarding vacuum deposition conditions, the substrate was fixed over the deposition boat, the substrate temperature was adjusted to about –130° C. and the pressure was reduced to a vacuum of $2\times10^{-6}$ Torr. Following that, vacuum deposition was carried out to a thickness of 500 nm at a rate of 10 nm a minute. A source 100-μm wide and 0.1-μm thick was then formed thereon with the lengthwise direction thereof orthogonal to the lengthwise direction of the drain, using silver particle paste and a leading-edge drawing method. FIG. 20 shows the gate voltage dependency of the source-drain current at a source-drain voltage of 4 V in the device thus fabricated. Using aluminum and silver for the electrodes makes it possible to hold down the Off-current to the $10^{-10}$ A level.

EXAMPLE 7

An n-type silicon substrate (area: 20×35 mm, thickness: 1.0 mm) on which a 300-nm thermally oxidized silicon film was grown to form an insulation layer 30, was subjected to 20 minutes of ultrasonic washing with a neutral detergent (PureSoft produced by Iuchi Seieidou Co.) diluted five-fold with pure water, followed by 20 minutes of ultrasonic washing in pure water to remove the detergent. An ultraviolet light-ozone washing device was then used to wash the substrate for 20 minutes by irradiating it with ultraviolet light in an oxygen atmosphere. A nickel mask was then utilized to vacuum-deposit onto the substrate thus washed, a gold drain 40 that was 100-μm wide and 0.2-μm thick. The film formation conditions at this time were a deposition rate of 6 nm a minute at a substrate temperature of 30° C. On the top thereof, for the semiconductor layer 50, the vacuum-deposition method was used to form a pentacene thin-film. Refined pentacene was used that had been sublimation-refined ten times. Regarding vacuum deposition conditions, the substrate was fixed over the deposition boat and the pressure was reduced to a vacuum of $2\times10^{-6}$ Torr. Following that, vacuum deposition was carried out to a thickness of 0.5 μm at a rate of 1 nm a minute. Then, a nickel mask was utilized to vacuum-deposit indium to form a source 60 that was 100-μm wide and 0.2-μm thick, with the lengthwise direction thereof orthogonal to the lengthwise direction of the drain 40. During this, 1-mm thick spacers were disposed to float the nickel mask off the substrate, allowing the electrode material to be wrapped around below the mask by the deposition of the gold electrode, thereby annealing the side face of the electrodes. The film formation conditions at this time were a deposition rate of 6 nm a minute at a substrate temperature of 30° C. A scanning electron microscope was used to observe the side face of the electrode thus formed and the scanning electron microscope image was used to find the angle formed between the side face of the electrode and the surface of the insulation layer, which was found to be about 150 degrees. The silicon wafer used for the substrate was used for the gate electrode 20. FIG. 8 shows the gate voltage dependency of the source-drain current at a source-drain voltage of 4 V in the device thus fabricated. The figure reveals that even when the gate voltage is changed, there is almost no change in the drain current, so no manifestation of a gate-electrode-based modulation effect.

INDUSTRIAL APPLICABILITY

Because the organic thin-film transistor of the present invention has a device structure composed of thin films, it can be manufactured using simple coating processes, making it very easy to adopt printing technology. At the same time, moreover, the device can be readily multiplied in the direction of the layers, facilitating three-dimensional integration. Furthermore, the structure is one in which the organic semiconductor layer is covered by the source, which has the effect of sealing the semiconductor layer, preventing degradation of the semiconductor by oxygen and moisture, thereby extending the service life of the device. In the device structure of the organic thin-film transistor of the invention, the channel length is controlled by the film thickness of the organic semiconductor layer, so a channel length of 1 μm or less can be readily realized, facilitating very low voltage operation. By using organic material and adapting printing technology, it is possible to form film devices, large-area devices and flexible devices, and impact resistance is also improved.

The invention claimed is:
1. A thin-film transistor comprising:
a substrate,
a gate electrode provided on a portion of the substrate,
an insulation layer arranged to cover the gate electrode and the substrate,
a source or drain provided on the insulation layer in a portion of a region corresponding to a region of the gate electrode,
a semiconductor layer arranged to cover the source or drain and the insulation layer,
a drain or source provided on the semiconductor layer in a region corresponding to a region of the source or drain that overlaps with the gate electrode, and
a channel formed between the source or drain and the drain or source and having a length defined by a film thickness of the semiconductor layer.
2. A thin-film transistor according to claim 1, wherein the drain or source has an upper part provided with another insulation layer.
3. A thin-film transistor according to claim 1, wherein the semiconductor layer is composed of organic semiconductor material.

4. A thin-film transistor according to claim 1, wherein the semiconductor layer has a thickness of not more than 1 μm.

5. A thin-film transistor according to claim 1, wherein the source or the drain and the drain or source are composed of substances having different work functions.

6. A thin-film transistor according to claim 5, wherein one of the source or the drain and the drain or source is composed of a material having a high work function selected from among gold, palladium, copper, nickel, indium-tin oxide and polythiophene, or materials that are a combination of a plurality thereof, or the other of the source or the drain and the drain or source is composed of a material having a low work function selected from among indium, aluminum, silver, calcium, magnesium and lithium or materials that are a combination of a plurality thereof.

7. A thin-film transistor according to claim 6, wherein the semiconductor layeris formed of a p-type organic semiconductor material, whichever of the source or the drain that is nearer to the gate electrode is composed of a material having a high work function and whichever of the source or the drain that is further from the gate electrode is composed of a material having a low work function.

8. A thin-film transistor according to claim 7, wherein the p-type semiconductor material is selected from among pentacene, tetracene, thiophene, phthalocyanine and derivatives thereof each with its terminal substituted, polythiophene, polyphenylene, polyphenylene vinylene, polyfluorene and derivatives thereof each with its terminal substituted or polymers of derivatives thereof each with its side chain substituted.

9. A thin-film transistor according to claim 6, wherein the semiconductor layer is formed of an n-type organic semiconductor material, whichever of the source or the drain that is nearer to the gate electrode is composed of a material having a low work function and whichever of the source or the drain that is further from the gate electrode is composed of a material having a high work function.

10. A thin-film transistor according to claim 9, wherein the n-type semiconductor material is selected from among perylene tetracarboxylic dianhydride, naphthalene tetracarboxylic dianhydride, fluorinated phthalocyanin and derivatives thereof each with its terminal substituted.

11. In a method of manufacturing a thin-film transistor in which a gate electrode, an insulation layer, a source or drain, a semiconductor layer, and a drain or source are formed on a substrate, the method of manufacturing a thin-film transistor comprising:

arranging the gate electrode on a portion of the substrate, covering the gate electrode and the substrate with the insulation layer, arranging the source or drain on the insulation layer in a region corresponding to a region of the gate electrode, covering the source or drain and the insulation layer with the semiconductor layer, forming the drain or source on the semiconductor layer in a region corresponding to a region of the source or drain to at least cover a portion of the source or drain that overlaps with the gate electrode, and forming a channel layer between the source or drain and the drain or source and having a channel length defined by a film thickness of the semiconductor layer.

12. A method of manufacturing a thin-film transistor according to claim 11 wherein at least part of component elements of the transistor are fabricated by coating or affixment of a solution.

13. A display device fabricated using a thin-film transistor according to claim 1.

14. A display device according to claim 13, including a display portion that is an electroluminescent device, a liquid crystal device or an electrophoresis device.

15. A memory device using ferroelectric material for all or part of the insulation layer contacting the gate electrode in a thin-film transistor according to claim 1.

16. A memory device according to claim 15, wherein the ferroelectric material is organic dielectric material.

17. A thin-film transistor integrated circuit, including a thin-film transistor according to claim 1 disposed at a plurality of locations.

18. A thin-film transistor according to claim 1, wherein the source or drain has a cross-sectional profile in which an angle θ formed between a film surface of the insulation layer and a side surface of the source or drain is not more than 130 degrees.

19. A thin-film transistor according to claim 1, wherein the source or drain has a cross-sectional profile in which an angle θ formed between a film surface of the insulation layer and a side surface of the source or drain is as close to 90 degrees as possible.

* * * * *